(12) United States Patent
Schmidt et al.

(10) Patent No.: US 7,426,012 B2
(45) Date of Patent: Sep. 16, 2008

(54) EXPOSURE DEVICE FOR IMMERSION LITHOGRAPHY AND METHOD FOR MONITORING PARAMETERS OF AN EXPOSURE DEVICE FOR IMMERSION LITHOGRAPHY

(75) Inventors: Sebastian Schmidt, Dresden (DE); Jens Schneider, Friedewald (DE); Guillaume Roesch, Dresden (DE)

(73) Assignee: Infineon Technologies, AG, Neubiberg (DE)

( * ) Notice: Subject to any disclaimer, the term of this patent is extended or adjusted under 35 U.S.C. 154(b) by 374 days.

(21) Appl. No.: 11/252,211

(22) Filed: Oct. 18, 2005

(65) Prior Publication Data

US 2006/0082748 A1 Apr. 20, 2006

(30) Foreign Application Priority Data

Oct. 18, 2004 (DE) ........................ 10 2004 050 642

(51) Int. Cl.
*G03B 27/42* (2006.01)
*G03B 27/52* (2006.01)
(52) U.S. Cl. .......................................... 355/53; 355/30
(58) Field of Classification Search .................. 355/30, 355/53, 55, 67–71; 250/548
See application file for complete search history.

(56) References Cited

U.S. PATENT DOCUMENTS

| | | | | |
|---|---|---|---|---|
| 5,610,683 A | * | 3/1997 | Takahashi | 355/53 |
| 5,825,043 A | * | 10/1998 | Suwa | 250/548 |
| 6,040,096 A | * | 3/2000 | Kakizaki et al. | 430/5 |
| 6,456,374 B1 | * | 9/2002 | Takeishi | 356/237.3 |
| 6,552,773 B2 | * | 4/2003 | Emoto | 355/53 |
| 6,992,750 B2 | * | 1/2006 | Kawashima et al. | 355/30 |
| 2006/0072088 A1 | * | 4/2006 | Lipson et al. | 355/53 |

FOREIGN PATENT DOCUMENTS

JP WO99/49504 * 9/1999

OTHER PUBLICATIONS

Aronstein, D., et al. "Optical Metrology for193nm Immersion Objective Characterization." *Proceedings of SPIE*, vol. 5377 (2004), A. 836-845.

* cited by examiner

*Primary Examiner*—Hung Henry Nguyen
(74) *Attorney, Agent, or Firm*—Edell, Shapiro & Finnan, LLC

(57) ABSTRACT

A method for monitoring parameters of an exposure device for immersion lithography and an exposure device for immersion lithography are provided. In the course of the immersion lithography, the immersion liquid is fed to an analysis device as early as during the exposure. Alterations of the immersion liquid are detected during the exposure process on the basis of a comparison with desired values. The triggering of a warning signal indicates the deviations of the parameters of alterations of the immersion liquid from the associated desired values.

31 Claims, 2 Drawing Sheets

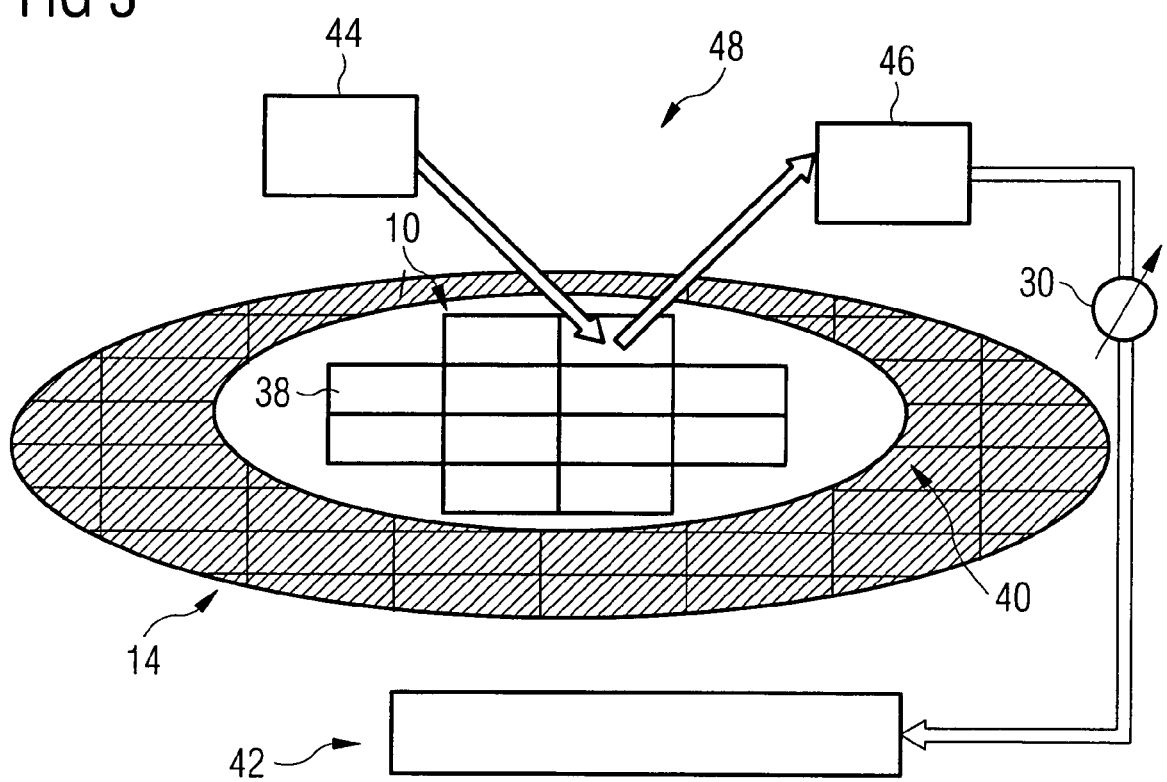

EXPOSURE DEVICE FOR IMMERSION LITHOGRAPHY AND METHOD FOR MONITORING PARAMETERS OF AN EXPOSURE DEVICE FOR IMMERSION LITHOGRAPHY

CROSS-REFERNCE TO RELATED APPLICATIONS

This application claims priority under 35 U.S.C. § 119 to German Application No. DE 10 2004 050 642.6, filed on Oct. 18, 2004 and titled "Method for Monitoring Parameters of An Exposure Device for Immersion Lithography, and Exposure Device for Immersion Lithography," the entire contents of which are hereby incorporated by reference.

FIELD OF THE INVENTION

The invention relates to an exposure device for immersion lithography and a method for monitoring parameters of an exposure device for immersion lithography

BACKGROUND

Integrated circuits are produced by photolithographic projection of patterns onto semiconductor wafers. For this purpose, layers provided with different electrical properties are usually applied on semiconductor wafers and in each case patterned lithographically. A lithographic patterning step may consist in applying a photosensitive resist, exposing the latter with a desired structure for the relevant layer and developing it, and subsequently transferring the resist mask thus produced into the underlying layer in an etching.

Dense line-space patterns such as those that are formed in the field of production of dynamic random access memories (DRAM) include structure elements having line widths of 110 nm or less, for example, in the region of the memory cell arrays.

Exposure devices are used in the field of semiconductor fabrication in order to form a pattern of structure elements in a photosensitive resist by lithographic projection on a semiconductor wafer coated with said resist. In this case, the choice of the lateral extent of the structure elements to be formed on the semiconductor wafer is restricted due to a lower resolution limit which is predetermined in particular by the exposure device. The resolution limit depends on many factors and is usually described in accordance with the following formula:

$$b_{min} = k_1 * \lambda / NA.$$

In this equation, $\lambda$ represents the wavelength of the light source of the projection apparatus, NA represents the numerical aperture and $k_1$ represents a factor dependent on various contributions such as, by way of example, the type of illumination, the resist layer used, the focus conditions and further parameters. In order to increase the resolution capability of the projection apparatus, three possibilities thus exist, in principle, these possibilities being discussed briefly below.

One possibility for increasing the resolution capability consists in reducing the exposure wavelength $\lambda$. Present-day projection apparatuses for photolithography use an exposure wavelength of 193 nm, for example. Efforts are currently being made in the art to reduce the exposure wavelength to 157 nm. However, exposure systems with such a short wavelength are associated with some technical problems.

The resolution limit of a projection apparatus can also be reduced by using modern lithographic techniques in the case of the masks used for the exposure. This relates first of all to the field of phase masks, which are also called phase shift masks. Moreover, different exposure modes are implemented, such as, by way of example, oblique illumination, quadrupol illumination or annular illumination, which likewise bring about an improvement in the resolution capability of the projection apparatus. These types of illumination are also referred to as OAI illumination (off-axis illumination) in the art. In contrast to perpendicularly incident illumination, significantly more higher orders of diffraction are transferred in the projection objective in the case of oblique illumination.

The so-called RET (resolution enhancement technique) methods are known as a further possibility; in these methods the structure elements on the mask often also contain, alongside the circuit patterns to be imaged, further elements that improve the resolution of the projection apparatus. Alongside the elements known in the art for an optical proximity correction (OPC) provision is also made for using structure elements lying below the resolution limit in the vicinity of structure elements to be formed.

These techniques, individually or in combination, enable the resolution capability of a projection apparatus to be significantly improved. It must be assumed, however, that at the currently prevailing exposure wavelength of 193 nm, the improvement possibilities can no longer be exhausted to an extent such that it would be possible, by way of example, to effect patterning with very small resolutions of 50 nm. The resolution capability can also be increased, however, if the numerical aperture NA is increased.

This is exploited in the case of immersion lithography, for example, in which the light of the projection apparatus is transmitted from the projection objective onto the resist layer not in air vacuum but rather within an immersion liquid (for example water). It is thus possible to retain values for the numerical aperture which are greater than 1. Together with a $k_1$ factor of about 0.3, it would thus be possible, at an exposure wavelength of 193 nm, to obtain a resolution capability of 50 nm without having to switch to the exposure wavelength of 157 nm, which is technologically problematic at the present time.

A problem to which little consideration has been given hitherto in this context is that the immersion liquid also influences the optical transmission. The immersion liquid is in direct contact with the resist layer or with a covering layer (so-called top coating) applied above the resist layer. During the exposure process, in the first place chemical actions are initiated in the resist layer, but in addition gases are also liberated and may escape from the resist layer. The high-energy short-wavelength exposure light also provides locally for heating of the resist layer and thus also of the immersion liquid. However, the immersion liquid likewise contributes to the imaging quality.

SUMMARY OF THE INVENTION

Therefore, it is an object of the invention to provide a method for monitoring parameters of an exposure device for immersion lithography and an exposure device for immersion lithography where the abovementioned problems are overcome.

This as well as other objects are achieved according to the invention by a method for monitoring parameters of an exposure device for immersion lithography. The method comprises the following steps: providing a semiconductor wafer including a resist layer applied on a front side of the semiconductor wafer; providing an exposure device including a lens that projects a pattern arranged on a mask into a projection image field, and further including one or more nozzles; providing a substrate holder suitable to accommodate the semiconductor wafer in the exposure device; placing the semiconductor wafer on the substrate holder; spraying the front side of the resist layer on the semiconductor wafer with an immersion liquid by the one or more nozzles so that, above the projection image field, the region between the resist layer and the lens is completely filled with the immersion liquid; successively projecting the pattern arranged on a mask into a multiplicity of exposure fields; providing an analysis device suitable to determine a plurality of parameters including a temperature of the immersion liquid, a refractive index of the immersion liquid and at least one further parameter of the immersion liquid during the successive projection; providing a desired value for each parameter; comparing the plurality of parameters with associated desired values; and triggering a warning signal on the basis of deviations of one parameter or of a plurality of parameters of the immersion liquid from the associated desired values.

According to the invention, in the course of the immersion lithography, the immersion liquid is fed to an analysis device as early as during the exposure. As a result, it is possible to detect alterations of the immersion liquid during the exposure process on the basis of a comparison with desired values. The triggering of a warning signal indicates the deviations of the parameters of alterations of the immersion liquid from the associated desired values. During the exposure operation, the reaction products in the resist layer as a result of the generally short-wavelength light from the light source also lead to an alteration of the refractive index of the immersion liquid. By determining the refractive index of the immersion liquid, it is thus possible to estimate the degree of contamination. The temperature likewise influences the optical properties of the immersion liquid. According to the invention, a further parameter of the immersion liquid is additionally determined in order to be able to better supervise the alterations or properties of the immersion liquid. Thus, during the exposure operation, the generally short-wavelength light from the light source leads to a temperature change in the resist layer. Since heat in the resist layer, through convection to the immersion liquid, also leads to an alteration of the temperature of the immersion liquid, it is thus possible, by determining the temperature of the immersion liquid, to estimate the degree of alteration of, for example, the temperature-dependent refractive index.

In a further preferred embodiment, the step of providing the exposure device comprises the projection image field being defined by an exposure slit. The principle of a wafer scanner that is known in the art can also be applied to the method in accordance with this embodiment. The exposure slit leads to a smaller projection image field in comparison with a wafer stepper, with the result that the resolution capability is significantly increased.

In a further preferred embodiment, the step of providing the substrate holder comprises the substrate holder being suitable to displace the semiconductor wafer in such a way that each of the exposure fields is exposed by the projection image field. This procedure likewise serves to apply the principle of a wafer scanner that is known in the art to the method in accordance with this embodiment. In this case, the substrate holder displaces the semiconductor wafer oppositely to the scanning direction of the exposure slit, so that each of the exposure fields is exposed by the projection image field.

In a further preferred embodiment, the semiconductor wafer is displaced at a speed of about 0.2 m/s. In order to increase the productivity of the photolithographic process, the speed at which the semiconductor wafer is displaced is chosen to be appropriately high without influencing the projection quality. Displacing the semiconductor wafer at a speed of about 0.2 m/s constitutes a customary value for present-day controllers and drives of the substrate holder, so that a cost-effective solution using conventional substrate holders can be achieved in the case of this embodiment of the method.

In a further preferred embodiment of the invention, the step of providing the exposure device comprises providing two nozzles arranged on opposite sides of the lens, and each nozzle emits the immersion liquid. The nozzles are provided for completely filling the region of the projection image field with the immersion liquid. In order to achieve homogeneous filling, nozzles arranged on opposite sides of the lens are provided in this embodiment, where the nozzles emit two opposite jets of immersion liquid.

In a further preferred embodiment, the immersion liquid is emitted at a speed of about 0.7 m/s. The speed of the jet of immersion liquid from the nozzles is first of all important for homogeneous and bubble-free filling of the region of the projection image field. Secondly, this also achieves cooling of the resist layer which is heated by the light from the light source during the lithography.

In a further preferred embodiment, water is used for the immersion liquid. A significant property of the immersion liquid is the refractive index. A high refractive index can be achieved with water as the immersion liquid.

In a further preferred embodiment, the step of providing the exposure device the exposure device including a light source suitable to emit light having a wavelength of 193 nm or less. In order to choose the resolution capability of the exposure device to be as high as possible, light having the shortest possible wavelength is usually used. The current exposure technology enables the use of wavelengths at 193 nm.

In a further preferred embodiment, the step of providing the exposure device comprises the exposure device having a numerical aperture which is greater than 1. The crucial advantage of immersion lithography resides in a high value that can be obtained for the numerical aperture. A value which is greater than 1 cannot currently be achieved with conventional exposure technology. Together with the currently controllable $k_1$ factor of 0.3 and the wavelength of 193 nm, it is thus possible to achieve a resolution capability of the exposure device of about 50 nm.

In a further preferred embodiment, the step of providing the analysis device comprises the analysis device being suitable to determine the pH value of the immersion liquid as a parameter of the immersion liquid during the successive projection. During the exposure operation, the generally short-wavelength light from the light source leads to chemical reactions and conversions in the resist layer. The immersion liquid flushes reaction products, such as acids and/or alkaline solutions, out of the resist layer. By determining the pH value of the immersion liquid, it is thus possible to estimate the degree of contamination.

In a further preferred embodiment, the step of providing the analysis device comprises the analysis device being suitable to determine the frequency and size of microbubbles in the immersion liquid as a further parameter of the immersion liquid during the successive projection. An excessively high flow velocity of the immersion liquid flowing out from the nozzles or excessively high heating locally may result in the formation of microbubbles in the immersion liquid, which impair the lithographic projection.

In a further preferred embodiment, the step of providing the analysis device comprises the analysis device being suitable to determine the electrical resistance of the immersion liquid as a further parameter of the immersion liquid during the successive projection. During the exposure operation, the reaction products in the resist layer as a result of the generally short-wavelength light from the light source also lead to an alteration of the electrical resistance of the immersion liquid, since the immersion liquid flushes reaction products out of the resist layer. By determining the electrical resistance of the immersion liquid, it is thus possible to estimate the degree of contamination.

In a further preferred embodiment, the step of providing the desired value for each of the one or plurality of parameters comprises the desired value being stored in a database. In order to be able to estimate the degree of contamination, a desired value is stored in a database for each desired value. The desired value may also be extended by a tolerance range or by other statistical quantities.

In a further preferred embodiment, the step of providing the desired value for each of the one or plurality of parameters comprises the desired value being determined on the basis of a reference exposure in which only an individual process step is performed. In order to determine the desired value, only a single exposure is performed in this embodiment. Since no contaminations or other alterations can occur, the measured values represent a good starting point for the desired values.

In a further preferred embodiment, the step of providing the analysis device comprises the analysis device including a contact-less temperature measuring system with a laser diode. A temperature measuring system with a laser diode represents a simple and cost-effective possibility for determining the temperature. Since the temperature measurement is contact-less, the temperature measuring system can be integrated into the exposure device without relatively great difficulty.

In a further preferred embodiment, the laser diode is furthermore suitable to determine a focus setting and a tilting of the projection optic of the projection device. Exposure devices often have a laser diode that is used for checking the projection optic. In accordance with this embodiment, the laser diode is supplied for a new use and also measures the temperature of the immersion liquid.

In a further preferred embodiment, the step of providing the substrate holder comprises the substrate holder including a plurality of regions whose temperature is in each case individually controlled in order to achieve a temperature compensation during the successive exposure of the exposure field. This procedure makes use of a substrate holder having temperature-supervised regions, which enables a local temperature compensation in individual exposure fields.

In another embodiment in accordance with the invention, an exposure device for immersion lithography comprises: a substrate holder to accommodate a semiconductor wafer with a resist layer applied on a front side of the semiconductor wafer; a lens to project a pattern arranged on a mask into a projection image field; one or more nozzles suitable to spray the front side of the resist layer on the semiconductor wafer with an immersion liquid such that, above the projection image field, a region between the resist layer and the lens is completely filled with the immersion liquid; an analysis device configured to determine a plurality of parameters including a temperature of the immersion liquid, a refractive index of the immersion liquid and at least one further parameter of the immersion liquid during a successive projection; a database configured to store desired values for each of the plurality of parameters; a comparator configured to compare the plurality of parameters with associated desired values; and a trigger to provide a warning signal on the basis of deviations of one parameter or a plurality of parameters from the associated desired values.

According to the invention, an analysis device in the case of immersion lithography is capable of detecting alterations in the immersion liquid during the exposure operation on the basis of a comparison with desired values.

The above and still further objects, features and advantages of the present invention will become apparent upon consideration of the following detailed description of specific embodiments thereof, particularly when taken in conjunction with the accompanying drawings where like numerals designate like components.

BRIEF DESCRIPTION OF THE DRAWINGS

FIG. 3 shows an exposure device for immersion lithography according to the invention.

DETAILED DESCRIPTION

The invention is explained below by way of example on the basis of an exposure device for immersion lithography and on the basis of a method for monitoring parameters of the exposure device for immersion lithography for producing an integrated circuit. However, the invention can also be applied to the production of other objects in the case of which the intention is to effect patterning with a pattern with a very high resolution.

Figure 1:
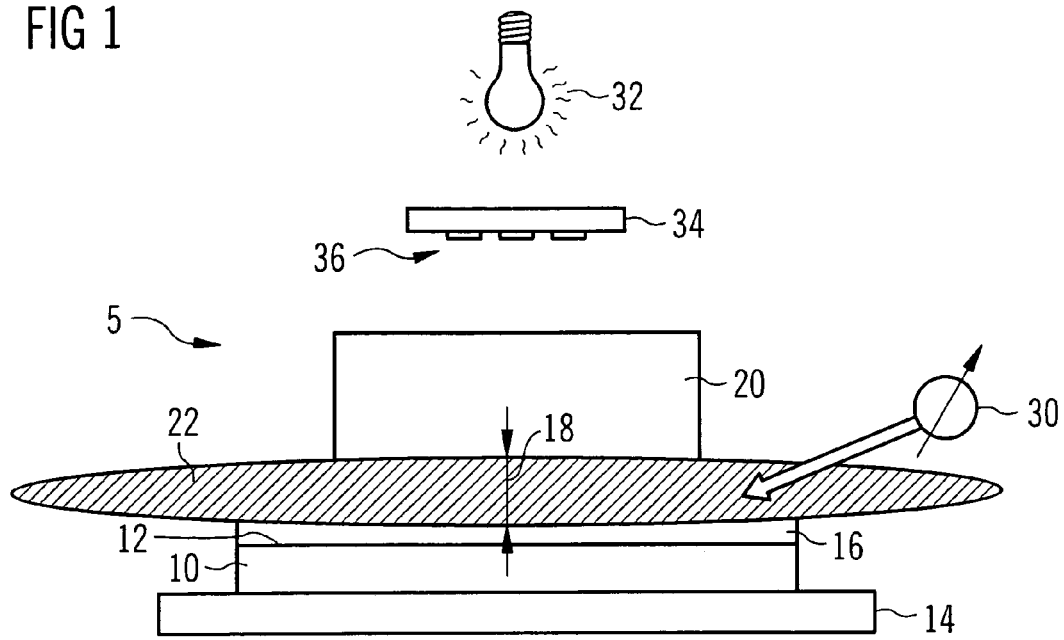
FIG. 1 schematically shows a cross-sectional view of a lithographic projection apparatus according to the invention for carrying out a method according to the invention.

FIG. 1 shows an exposure device 5 for immersion lithography. The exposure device 5 includes a substrate holder 14, on which a semiconductor wafer 10 is placed. The semiconductor wafer 10 is provided with a resist layer 16 on a front side 12 of the semiconductor wafer. The resist layer 16 is applied by spinning-on, by way of example. The exposure device 5 further includes a lens 20, which projects light from a light source 32 onto the resist layer 16 of the semiconductor wafer 10. The light source 32 emits light having a wavelength of 248 nm or 193 nm, for example, by a DUV laser. The light source 32 is arranged above the substrate holder 14. The projection objective with the lens 20 is situated between the substrate holder 14 and the light source 32. A photomask 34 provided with a pattern 36 is fitted between the light source 32 and the lens 20.

The exposure device 5 is suitable for carrying out an exposure within a projection image field on the resist layer 16. The exposure device 5 furthermore has one or more nozzles 26, which spray the front side 12 on the semiconductor wafer 10 above the resist layer 16 with an immersion liquid. In this case, the interspace which arises from the resist layer 16 and the projection objective arranged at a distance 18 above the resist layer 16 is to be completely filled with the immersion liquid. The distance 18 between the resist layer 16 and the lens 20 is 10 mm, for example.

Figure 2:
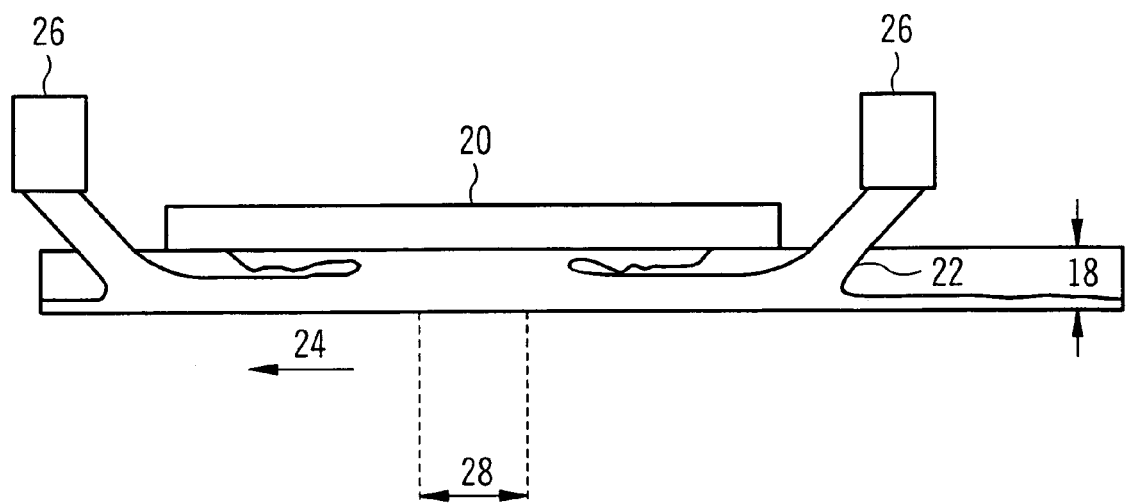
FIG. 2 shows a cross-sectional view of a portion of the lithographic projection apparatus of FIG. 1 and including nozzles.

As is shown in FIG. 2, in the case of exposure devices for immersion lithography, the nozzles 26 are often arranged laterally with respect to the lens 20. The nozzles 26 spray the immersion liquid 22 into the interspace between the resist layer 16 and the lens 20 at a speed of about 0.7 m/s.

Water is usually used for the immersion liquid 22. Other liquids known to the person skilled in the art are not excluded, however. Using the immersion liquid 22, a numerical aperture which is greater than 1 can be achieved in the case of the exposure device 5.

The semiconductor wafer 10 with the resist layer 16 is displaced along a displacement direction 24 by the substrate holder 14 during the lithographic projection. The known principle of a wafer scanner is used in this case, in which an exposure slit (not shown in FIGS. 1 and 2) is situated between mask 34 and lens 20. The exposure slit is displaced along a direction opposite to the displacement direction 24, so that the pattern 36 on the mask 34 is transferred onto the resist layer 16 within the projection image field 28.

The exposure device 5 further includes an analysis device 30, to which immersion liquid 22 is fed during the projection of the pattern 36 arranged on the mask 34. For this purpose, a small suction tube, for example, is provided (not shown in FIG. 1), which takes up samples of the immersion liquid 22 and transfers the samples to the analysis device 30. However, it is also conceivable to take up the immersion liquid 22 draining away from the edge of the semiconductor wafer 10 and to transfer it to the analysis device 30. The analysis device 30 is suitably configured to determine parameters of the immersion liquid 22, as is explained in more detail below.

Since parameters of the immersion liquid 22 make a crucial contribution to the quality of the lithographic projection onto the resist layer 16, precise knowledge of these quantities is necessary for the accuracy of the lithographic projection. A number of quantities are taken into consideration as measurement parameters.

The analysis device 30 determines changes in the chemical composition of the immersion liquid 22 or to ascertain the contamination thereof. In general, all parameters that might influence the optical quality of the immersion liquid 22 during the exposure should be supervised. During the exposure, in the first place chemical reactions are initiated in the resist layer 16, resulting in contamination in the immersion liquid 22. In addition to solvents and dissolved oxygen or nitrogen, there are also alkaline solutions that are flushed away by the immersion liquid 22. In order to detect alterations, a whole series of measurement parameters are provided. Firstly, it is possible to determine the pH value of the immersion liquid 22, but it is also possible to determine the refractive index or the electrical resistance of the immersion liquid 22. The occurrence and the size of microbubbles in the immersion liquid 22 also influence the lithographic projection. The analysis device 30 is capable of determining such parameters of the immersion liquid 22 in any conventional or other suitable manner.

The parameters measured and recorded by the analysis device 30 are subsequently compared with desired values. The desired values may be stored in a database, by way of example. A processor can be connected both to the analysis device 30 and to the database, so as to enable a comparison which leads to a warning signal in the event of an excessively large deviation of one of the parameters. The warning signal may be used, for example, to control the supply of immersion liquid 22.

A further parameter that is important for immersion lithography is the temperature of the immersion liquid 22. The temperature of the immersion liquid 22 can also be determined by the analysis device 30. For this purpose, the analysis device 30 is advantageously extended by a contact-less temperature measuring system 48, as shown in FIG. 3. The contact-less temperature measuring system 48 includes a light emitting diode 44 and a detector 46. The light emitting diode 44 emits light onto the front side 12 of the semiconductor wafer 10 (e.g., in the exposure fields 38). The reflected light is detected by the detector 46. Thus, the temperature measuring system is capable of measuring the temperature of the immersion liquid without contacting the liquid (i.e., the system is contact-less). In one embodiment of the exposure device 5, the laser diode 44 is fitted laterally with respect to the projection objective specially for this purpose.

However, it is also possible to use a laser diode 44 which is often provided in exposure devices for supervising the focus setting of the projection objective with the lens 20 or for aligning the beam axis of the projection objective with the lens 20. In this case, the light from the laser diode that passes through the projection objective of the lens is detected, which is used to determine the beam path within the projection objective and from this the focus setting of the projection objective or the possible misalignment of the beam axis of the projection objective (tilting).

In a further embodiment of the exposure device 5 for immersion lithography, provision is made for using the measurement results of the analysis device 30 not just for triggering a warning signal, but for feeding them back actively to the exposure apparatus. Thus, by way of example, it is possible to use the temperature measurement as measured by the analysis device 30 in order to control the temperature distribution on the semiconductor wafer 10.

For this purpose, as shown in FIG. 3, the semiconductor wafer 10 is placed on the substrate holder 14, which is subdivided into individual temperature-supervised regions. The temperature-supervised regions 40 can be arranged, for example, in checkered fashion (e.g., in square or rectangular grid fashion) on the top side of the substrate holder 14. Each of the temperature-supervised regions 40 can be individually regulated by a temperature controller 42 in a manner dependent on the measurement results of the analysis device 30. Consequently, it is possible to achieve a homogeneous temperature distribution over the surface of the semiconductor wafer 10.

Utilizing the exposure device 5 and the method for monitoring the exposure device 5 according to the invention, it is possible to supervise, in a simple manner, lithographic patterning processes during immersion lithography. In particular, the method according to the invention permits monitoring of the immersion liquid 22 as early as during the lithographic patterning. It is thereby possible, as early as during the lithographic patterning, to initiate corresponding measures, such as exchanging the immersion liquid, controlling the temperature or changing the exposure mode, which would otherwise make the optical transmission quality worse.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for monitoring parameters of an exposure device for immersion lithography, comprising:
   providing a semiconductor wafer including a resist layer applied on a front side of the semiconductor wafer;
   providing an exposure device including at least one nozzle and a lens to project a pattern arranged on a mask into a projection image field on the resist layer;
   providing a substrate holder configured to accommodate the semiconductor wafer in the exposure device;
   placing the semiconductor wafer on the substrate holder;

spraying a front side of the resist layer on the semiconductor wafer with an immersion liquid via the at least one nozzle such that, above the projection image field, a region between the resist layer and the lens is completely filled with the immersion liquid;

successively projecting the pattern arranged on the mask into a plurality of exposure fields of the semiconductor wafer;

providing an analysis device configured to determine a plurality of parameters including a frequency and size of microbubbles in the immersion liquid and at least one further parameter of the immersion liquid during the successive projection;

providing a desired value for each parameter;

comparing the plurality of parameters with associated desired values; and triggering a warning signal on the basis of at least one deviation of at least one parameter of the immersion liquid from an associated desired value.

2. The method of claim 1, wherein the projection image field is defined by an exposure slit.

3. The method of claim 2, wherein the substrate holder is further configured to displaced the semiconductor wafer in a manner such that each of the exposure fields is exposed by the projection image field.

4. The method of claim 3, wherein the semiconductor wafer is displaced at a speed of about 0.2 m/s.

5. The method of claim 1, wherein two nozzles are arranged on opposite sides of the lens, and each nozzle emits the immersion liquid.

6. The method of claim 5, wherein the immersion liquid is emitted at a speed of about 0.7 m/s.

7. The method of claim 1, wherein the immersion liquid comprises water.

8. The method of claim 1, wherein the exposure device includes a light source that is configured to emit light at a wavelength of no greater than 193 nm.

9. The method of claim 8, wherein the exposure device has a numerical aperture that is greater than 1.

10. The method of claim 1, wherein the analysis device is configured to determine a pH value of the immersion liquid as a further parameter of the immersion liquid during the successive projection.

11. The method of claim 1, wherein the analysis device is configured to determine at least one of a temperature of the immersion liquid and a refractive index of the immersion liquid during the successive projection.

12. The method of claim 1, wherein the analysis device is configured to determine the electrical resistance of the immersion liquid as a further parameter of the immersion liquid during the successive projection.

13. The method of claim 1, wherein the step of providing the desired value for each parameter is stored in a database.

14. The method of claim 13, wherein each desired value is determined on the basis of a reference exposure in which only an individual process step is performed.

15. The method of claim 13, wherein the plurality of parameters are stored in the database.

16. The method of claim 1, wherein the analysis device includes a contact-less temperature measuring system with a laser diode.

17. The method of claim 16, wherein the laser diode is configured to determine a focus setting and a tilting of a projection optic of the lens of the exposure device by emitting a light beam through the projection optic.

18. The method of claim 1, wherein the substrate holder includes a plurality of regions, and the temperature of each region is individually controlled so as to achieve a temperature compensation during the successive exposure of the exposure field.

19. The method of claim 18, wherein a maximum temperature difference between at least two different exposure fields is 0.5° C.

20. An exposure device for immersion lithography, comprising:

a substrate holder configured to accommodate a semiconductor wafer that includes a resist layer applied on a front side of the semiconductor wafer;

a lens configured to project a pattern arranged on a mask into a projection image field on the resist layer;

at least one nozzle configured to spray a front side of the resist layer on the semiconductor wafer with an immersion liquid such that, above the projection image field, a region between the resist layer and the lens is completely filled with the immersion liquid;

an analysis device configured to determine a plurality of parameters including a frequency and size of microbubbles in the immersion liquid and at least one further parameter of the immersion liquid during the successive projection of the pattern arranged on the mask into a plurality of exposure fields of the semiconductor wafer;

a database configured to store desired values for each of the plurality of parameters;

a comparator to compare the plurality of parameters with associated desired values; and a trigger configured to provide a warning signal on the basis of at least one deviation of at least one parameter of the immersion liquid from an associated desired value.

21. The exposure device of claim 20, further comprising an exposure slit that delimits the projection image field.

22. The exposure device of claim 21, wherein the substrate holder is further configured to displace the semiconductor wafer so as to expose each of the exposure fields of the semiconductor wafer by the projection image field.

23. The exposure device of claim 20, wherein two nozzles are arranged on opposite sides of the lens, and each nozzle emits the immersion liquid.

24. The exposure device of claim 20, wherein the immersion liquid comprises water.

25. The exposure device of claim 20, further comprising a light source configured to emit light having a wavelength of no greater than 193 nm.

26. The exposure device of claim 25, wherein the exposure device has a numerical aperture that is greater than 1.

27. The exposure device of claim 20, wherein the analysis device is further configured to determine a pH value of the immersion liquid as a further parameter of the immersion liquid during the successive projection.

28. The exposure device of claim 20, wherein the analysis device is configured to determine at least one of a temperature of the immersion liquid and a refractive index of the immersion liquid during the successive projection.

29. The exposure device of claim 20, wherein the analysis device is further configured to determine the electrical resistance of the immersion liquid as a further parameter of the immersion liquid during the successive projection.

30. The exposure device of claim 20, wherein the analysis device includes a contact-less temperature measuring system with a laser diode.

31. The exposure device of claim 30, wherein the laser diode is configured to determine a focus setting and a tilting of a projection optic of the lens of the exposure device by emitting a light beam through the projection optic.

* * * * *